United States Patent
Boezen et al.

(10) Patent No.: US 8,527,822 B2
(45) Date of Patent: Sep. 3, 2013

(54) SYSTEM AND METHOD FOR SINGLE TERMINAL BOUNDARY SCAN

(75) Inventors: Henk Boezen, Nijmegen (NL); Leon Van de Logt, Son (NL); Liquan Fang, Malden (NL)

(73) Assignee: NXP B.V., Eindhoven (NL)

( * ) Notice: Subject to any disclaimer, the term of this patent is extended or adjusted under 35 U.S.C. 154(b) by 881 days.

(21) Appl. No.: 12/581,651

(22) Filed: Oct. 19, 2009

(65) Prior Publication Data

US 2011/0093751 A1    Apr. 21, 2011

(51) Int. Cl.
*G01R 31/3177* (2006.01)
*G01R 31/40* (2006.01)

(52) U.S. Cl.
USPC .......................................... 714/727; 714/733

(58) Field of Classification Search
None
See application file for complete search history.

(56) References Cited

U.S. PATENT DOCUMENTS

| | | | |
|---|---|---|---|
| 3,979,746 A | 9/1976 | Jarrett | |
| 6,653,957 B1 | 11/2003 | Patterson | |
| 6,675,333 B1 * | 1/2004 | Whetsel | 714/726 |
| 6,807,644 B2 | 10/2004 | Reis et al. | |
| 7,475,313 B2 * | 1/2009 | Damodaran et al. | 714/733 |
| 7,707,467 B2 | 4/2010 | Louie et al. | |
| 7,949,919 B2 * | 5/2011 | Wu et al. | 714/727 |
| 2005/0160337 A1 * | 7/2005 | Whetsel | 714/726 |
| 2007/0061524 A1 | 3/2007 | Thomsen | |
| 2007/0061646 A1 * | 3/2007 | Whetsel | 714/726 |
| 2008/0201497 A1 | 8/2008 | Ooi | |
| 2008/0250282 A1 * | 10/2008 | Whetsel | 714/724 |

FOREIGN PATENT DOCUMENTS

| | | |
|---|---|---|
| EP | 1 189 070 A2 | 3/2002 |
| KR | 2005034435 A * | 4/2005 |
| WO | 2008/103793 A1 | 8/2008 |

OTHER PUBLICATIONS

European Search Report (EP 10 18 7937) Feb. 4, 2011 pp. 5.
An Introduction to IEEE P1149.7—IEEE P1149.7: A Complementary Superset of the IEEE 1149.1 Standard—Stephen Lau—Apr. 3, 2009—TI Public Data, Application Report Texas Instruments—JTAG.Koesler, Lutsch.

* cited by examiner

*Primary Examiner* — Ajay Bhatia
*Assistant Examiner* — Dipakkumar Gandhi

(57) ABSTRACT

An electronic circuit having a boundary scan test circuit receives, though one pin, an embedded clock encoded test signal having an encoded bit stream having occurrences of a first header followed by at least one encoded boundary scan mode bit and an encoded second header followed by at least one boundary scan test input bit. The bit stream and the clock are extracted and occurrences of the first header and second header are detected. Based on the detected occurrences the boundary scan mode bits and boundary scan input bits are identified and distributed to the electronic circuit, along with the extracted clock, and boundary scan test is performed.

19 Claims, 3 Drawing Sheets

SYSTEM AND METHOD FOR SINGLE TERMINAL BOUNDARY SCAN

TECHNICAL FIELD

Embodiments relate generally to test signal terminals and interfacing with electrical circuits.

BACKGROUND

Integrated circuit (IC) chips often embody complex, large scale circuitry such as, for example, random access memories (RAMs), various programmable state machines ranging from simple controllers to complex instruction set central processing units (CPUs), digital input/output buffers, electrically erasable programmable memories (EEPROMs), analog to digital converters (ADCs), digital to analog converters (DACs), and various analog circuitry such as, for illustrative example, pre-amplifiers, equalizers, frequency tunable bandpass filters, temperature sensors, and power converters.

In addition to complexity, digital circuitry of IC chips is operating at increasing clock rates and, similarly, analog circuitry at higher frequencies and wider bandwidths. Such performance parameters generally necessitate smaller feature (e.g., transistor) sizes and, similarly, a higher precision and control for each of a larger sequence of chip fabrication steps.

As known in the IC chip fabrication arts, despite continuing progress in fabrication technology and equipment quality, faults sometimes occur in the fabrication process. For purposes of this description, the term "fault" means any fabrication error that results in the finished IC chip failing, at any point within its given range of operating environments, to meet all of its given function and performance specifications, in response to any possible combination and/or sequence of signal inputs and/or program instructions that the IC chip may encounter while performing in its specified or intended system environment.

Various methods for detecting such faults are known, typically applying values and sequences input signals, instruction sets, and other conditions, methodically formulated or calculated to exercise at least a sufficient percentage of, or subsets of the devices (e.g., logic gates, flip-flops), required to detect faults, to at least a specified probability.

Often faults may manifest only during certain operating conditions, or when the IC chip is operating in particular modes, or only in response to certain sequences of chip operations and/or signal inputs. The testing therefore must employ particularly calculated values and sequences of, for example, chip control and input signals, both to check how the IC chip or system responds to particular sequences previously identified as detecting faults, and to identify faults not detected in previous testing of the same type of IC chip.

One method for such testing for such faults is termed "boundary scan testing." The theory of boundary scan testing is known to persons of ordinary skill in the IC chip arts, and to persons of ordinary skill in the multi-chip, packaged system arts. Further detailed description of the theory of boundary scan testing is therefore omitted.

However, also known to persons of ordinary skill in the IC chip and multi-chip system arts is the overhead in terms input/output (I/O) pins necessary for boundary scan testing to meet even the existing testability requirements. A prime example is the four-to-five pins required by the IEEE 1149.1 standard, (formally entitled "Standard Test Access Port and Boundary-Scan Architecture") and much more commonly referred to as "JTAG", the acronym of the industry group called the "Joint Test Action Group," that developed it. As known to persons of ordinary skill in the art, the I/O pin requirement of JTAG is often termed "four-to-five" pin because one of the signals, the "Test Rest," or "TRST" is optional.

The JTAG standard was released in 1990, and has been adopted industry-wide from approximately 2001 to the present. The problem of the I/O pin overhead required to meet the four-to-five pin JTAG interface, and the need for a practical, economical solution to the overhead problem, has been known since the adaptation of the standard.

SUMMARY

Various general embodiments of the present invention provide, among other features and benefits, a true one-wire boundary scan test interface to IC chips and IC based devices, that may be practiced upon reading this disclosure to meet substantially any known or anticipated multi-pin protocol, including the well-known JTAG four-to-five pin interface.

One example embodiment provides, among other features, a boundary scan interface that actually requires zero dedicated terminals. This feature of zero dedicated terminals, according to its various aspects, provides various and significant benefits such as, for example, flexibility in the types and arrangements of chips that, with minimal cost, can concurrently meet given performance requirements and, as will be understood, can exceed current capability to meet given testability requirements.

Similarly, as will be understood by persons of ordinary skill in the art based on this disclosure, the various example embodiments provide, among other features and benefits, for quick and economical adaptation to different boundary scan protocols, as well as upgrading to future boundary scan methods, with the adaptation and upgrade likely to require little, if any, significant chip redesign.

Still further, various example embodiments provide, among other features and benefits, a low cost, low man-hour portability of expensively acquired knowledge bases developed on JTAG or equivalent multi-pin protocols, to the single-pin and zero-dedicated pin protocol features of the various example embodiments.

One first example testable electronic circuit according to one or more of the example embodiments may include an embedded clock decoder circuit connected to an input/output (I/O) terminal, the decoder circuit configured to receive a given embedded clock encoded signal having encoded test information bits, and to recover and output the test information bits and a recovered test clock signal. According to one aspect, the decoder circuit may include a Manchester decoder, configured to receive, as the embedded clock encoded signal, a given Manchester encoded signal having encoded test information bits and a recoverable, embedded test clock.

According to one aspect, one or more of the example embodiments may include a boundary scan test signal decoder circuit, configured to receive the test information bits and the recovered test clock signal and to detect a sequence of the test information bits meeting a given preamble sequence and, in response to this detecting, to generate test state control bits based on subsequently received test information bits.

According to one aspect, one example of a boundary scan test signal decoder circuit of one example testable electronic circuit according to one or more of the example embodiments may be configured to detect a sequence of the test information bits meeting any of a given first preamble sequence and a given second preamble sequence and, in response to detecting a sequence of the test information bits meeting the first preamble sequence, to generate JTAG format Test Mode Select (TMS) bits based on subsequently received test information bits and, in response to detecting a sequence of the test information bits meeting the second preamble sequence, to generate JTAG format Test Data In (TDI) bits based on subsequently received test information bits.

According to one aspect, one example testable electronic circuit according to one or more of the example embodiments may include an electronic function circuit connected to the I/O terminal, and the electronic function circuit may be configured to be switchable, in response to a given value of the test information bits, between an operational mode and a test mode, and may be configured to perform in the test mode a test operation in accordance with the test state control bits and the recovered test clock signal, and to output a corresponding test output data signal.

One second example testable electronic circuit according to one or more of the embodiments may include features and aspects such as the previously described one first example, and may further include an electronic function circuit configured to switch among a plurality of given test modes in response to the value of the sequence of the test information bits meeting the given preamble sequence.

According to one aspect, one example testable electronic circuit according to one or more of the embodiments may include features and aspects such as the previously described one first example, and further include an embedded clock decoder circuit having a frequency qualifier circuit to detect whether a frequency of the signal received on the terminal meets a given signal valid criteria and, in response to detecting the signal meeting the given signal valid criteria, qualifies the signal as a given embedded clock encoded signal and generates the test information bits and the recovered test clock signal and, in response to the detected frequency not meeting the given signal valid criteria, does not generate the test information bits.

Further according to this one aspect, the boundary scan test signal decoder circuit may be configured to detect, based on the detected frequency not meeting the given signal valid criteria for a given timeout duration, a timeout of the embedded clock encoded signal on the I/O terminal. Still further according to this one aspect, the boundary scan test signal decoder circuit may be configured to generate the test mode selection bits based on the test information bits and may be configured to terminate the generating of the test mode selection bits in response to detecting the timeout.

Various example methods according to one or more of the example embodiments may be performed on an example environment of an electronic circuit having a conventional JTAG boundary scan test controller configured to receive chip internal conventional JTAG Test Mode Select (TMS) bits, JTAG Test Data Input (TDI) bits to selectable portions of the electronic circuit and to detect states of the electronic circuit in relation to the given TMS and TDI.

One example method carrying out one or embodiments includes generating an embedded clock encoded signal having an encoded first header followed by at least one encoded TMS or equivalent bit and an encoded second header followed by at least one TDI or equivalent bit, receiving this generated embedded clock encoded signal at the above-described terminal, and extracting test bits and a test clock from the received embedded clock encoded signal. According to one of the various example embodiments, one example method further includes detecting an occurrence of the encoded first header in the extracted test bits and, in response, generating a sequence of at least one TMS bit based on the at least one TMS bit following the detected occurrence. Likewise, such an example may further include detecting an occurrence of the encoded second header in the extracted test bits and, in response, generating a sequence of at least one TDI bit based on the at least one TDI bit following this detected occurrence, and then performing a JTAG boundary scan test in accordance with the generated TMS bits, said generated TDI bits, and said extracted test clock.

The above-summarized illustrative examples of advances and features of the various exemplary embodiments and aspects are not intended to be exhaustive or limiting of the possible advantages that may be realized. Other advantages of the various exemplary embodiments will be apparent from the various embodiments and aspects that are further described with illustrative detail, and persons of ordinary skill in the art will, upon reading this disclosure, readily identify further variations within the scope of the appended claims, as well as additional applications.

DETAILED DESCRIPTION

Figure 1:
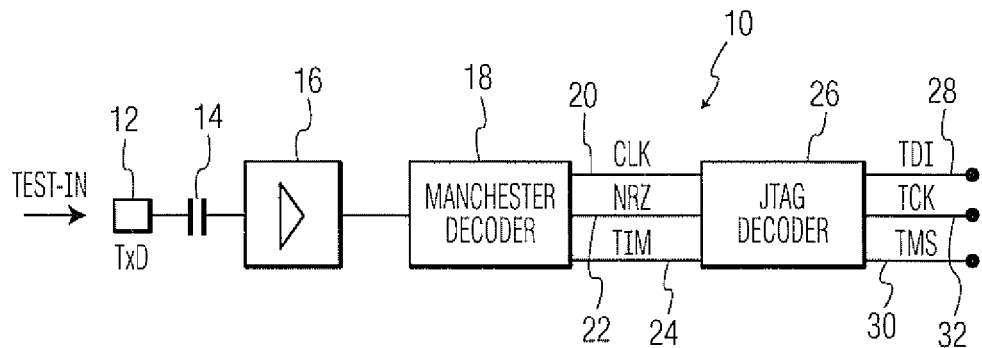
FIG. 1 shows one example high-level functional schematic of one example single input terminal embedded clock boundary scan test decoder of one or more systems and methods according to one or more embodiments.

Various examples according to exemplary embodiments are described in reference to specific example configurations and arrangements. The specific examples are only for illustrative purposes, selected to further assist a person of ordinary skill to form an understanding of the concepts sufficient for the person, applying the knowledge and skills such persons possess, to practice the invention. The scope of the embodiments and the range of implementations, however, are not limited to these specific illustrative examples. On the contrary, as will be recognized by persons of ordinary skill in the relevant arts upon reading this description, other configurations, arrangements and implementations practicing one or more of the embodiments, and one or more various aspects of each, may be designed and constructed.

As will be understood by persons of ordinary skill in the art, figures may not be drawn to scale, in that relative sizes and placements of items are not necessarily representative of the items' relative quantity of structure or relative importance of functions but, instead, may be arbitrary or may be chosen to provide a clear depiction of the figure's illustrated example subject matter.

As will also be understood by persons of ordinary skill in the art upon reading this disclosure, various details of, for example, algorithms, protocols, and hardware technologies that are well known to such persons are omitted, to avoid obscuring novel features and aspects. Similarly, at instances at which details are included, it will be readily understood by persons of ordinary skill in the art, from the context of the instance, that the details may not be complete and, instead, may only be described to the extent pertinent to particular features and aspects of an embodiment.

Example embodiments and aspects may be described separately, or as having certain differences. Separate description or description of differences, however, does not necessarily mean the respective embodiments or aspects are mutually exclusive. For example, a particular feature, function, or characteristic described in relation to one embodiment may be included in, or adapted for other embodiments.

In overview, the general embodiments include what will be termed herein as a "functional electronic circuit," preferably arranged as a plurality of modules such as, for example, central processing units (CPUs) and other state machines, RAMs, EEPROMs, dedicated processing units such as, for example, multipliers and other arithmetic logic units (ALUs), ADC and DAC units, as well as various circuit structures smaller than what would be termed a "module" by persons of ordinary skill in the IC arts, interconnected by, for example, various data, address and/or instruction busses, control lines, and analog transmission paths.

The particular modules of the functioning electronic circuit and their arrangement are not necessarily specific to the practice of these embodiments and, therefore, further detailed description is omitted. Also, the entire functional electronic circuit may be, but is not necessarily formed on a single IC and, likewise, the entire functioning electronic circuit may comprise, for example, multiple chips within a single package, or even a plurality of packaged devices supported and arranged on a substrate such as, for example, a printed circuit card.

The general embodiments preferably include a boundary scan test controller, configured to receive boundary scan test mode bits and boundary scan test input data bits from a boundary scan test interface decoder that is described in greater at later sections as extracting and generating these signals from a true single-wire interface. The general embodiments also preferable include the functioning electronic circuit as having sufficient internal boundary scan testing busses and testing control lines, as well as boundary scan test registers, and other hardware for the boundary test controller to generate boundary test control signals, based on its received boundary scan test mode bits and boundary scan test input data bits, to perform a given range of boundary scan testing of the modules and other structures forming the functional electronic circuit.

The boundary scan test controller, and all of the above-described boundary scan test hardware except for the boundary scan test interface decoder may be in accordance with conventional boundary scan test methodologies and technologies such as, for example, JTAG. JTAG boundary scan test methodologies and technologies are well known to persons of ordinary skill in the IC arts that pertain to this invention, and upon reading this entire disclosure such persons can readily apply that knowledge of JTAG methodologies and technologies to this disclosure to readily practice according to the described embodiments, without having to perform any undue experimentation, further detailed description is omitted.

For purposes of convenience, however, the present inventors hereby incorporate by reference the JTAG standard, which is readily available to persons of ordinary skill in the art, and hereby incorporate by reference all sections of U.S. Pat. No. 7,409,612 ("the '612 patent") that describe chip internal hardware, and chip internal algorithms and chip internal methodologies for performing IEEE 1149.1 standard (i.e., JTAG) boundary scan testing. As one illustrative example, the boundary test scan controller of a testable electronic circuit according to one or more of the general embodiments may be implemented by the "TAP" controller described by the '612 patent, modified to receive boundary scan test mode bits and boundary scan test input data bits from a boundary scan test interface decoder that is described in greater at later sections, instead of the TDI, TCK, TMS and TRST inputs from chip terminals.

Some examples according to the various general embodiments are described in reference to the JTAG boundary scan testing protocol, and example operations and configurations of these are described in reference to internally extracting and generating only the TDI, TCK and TMS signals, while omitting explicit description of examples that also extract and generate the JTAG TRST, or an equivalent boundary scan test reset signal. However, persons of ordinary skill in the art will readily identify, based on this disclosure, one or more implementations employing, for example the same general arrangements described as extracting and generating the TDI, TCK and TMS signals, with minor modifications to also extract and generate the TRST signals.

According to one or more general embodiments, the boundary scan test interface decoder is configured to receive, on one terminal, an embedded clock test input signal, having encoded test information bits, and to extract the test information bits and a recovered test clock from the embedded clock test signal, and to output test information bits and the recovered test clock. According to one aspect, the one terminal may be a terminal used by the functioning electronic circuit during normal operation and, therefore, various example embodiments may be practiced with zero dedicated pins. According to one aspect, the one pin may be a power pin of the functioning electronic circuit.

According to one or more examples using JTAG protocol boundary scan test, the embedded clock test input signal may be a single line signal carrying in serial fashion TMS bits and TDI bits, with the TCK clock being the embedded clock. According to one or more examples the embedded clock test input signal is generated by a readily constructed test equipment that simply converts JTAG TMS and TDI bits generated by known JTAG methods into a single embedded clock test input signal, delineates the TMS bits by a first header and TDI bits by a second header. For purposes of convenience the first header will be referenced as the "TMS header" and the second header will be referenced as the "TDI header." According to one example, the format of the single embedded clock test signal may consist of placing TMS bits in serial fashion after each TMS header and TDI bits in serial fashion after each TDI header.

Continuing with the above-described example embodiments employing JTAG boundary scan encoding, the boundary scan test interface decoder is configured to receive the single line embedded clock test signal, extract the bits and the clock from the signal, and to detect TMS headers and TDI headers by inspecting the series of extracted bits and, upon each such detection, to generate a sequence of one or more TMS bits or TDI bits, as well as a TCK signal from the extracted clock.

As will be understood upon reading this disclosure, the JTAG boundary scan test interface decoder may be incorporated into, or integrated with, the functioning electronic circuit and its associated JTAG boundary scan controller and the JTAG boundary scan devices that, as known to persons of ordinary skill in the art of JTAG testable IC design and fabrication, are integrated with and distributed throughout the functioning electronic circuit.

According to one aspect, the embedded clock test signal may be a Manchester encoded signal, in which case the JTAG boundary scan test interface decoder will include a Manchester decoder.

As described above, one or more example embodiments employing JTAG boundary scan encoding may have a boundary scan test interface decoder configured to receive the single line embedded clock test signal, extract the bits and the clock from the signal, detect TMS headers and TDI headers by inspecting the series of extracted bits and, upon each such detection, generate a sequence of one or more TMS bits or TDI bits, as well as a TCK signal from the extracted clock.

According to one aspect, the single line embedded clock test signal may be generated to include "timeouts" at the end of each sequence of TDI and TMS bits. The timeout may be formed as a constant state of the single line embedded clock test signal that extends more than a given threshold, i.e., a signal state of no edge transition lasting more that the threshold. According to one example, the threshold may be approximately 1.5 bit widths of the Manchester encoded signal. Further to this one example aspect, the JTAG (or equivalent format) boundary scan test interface decoder may be configured to detect the timeouts, and may be configured to employ these, for example, to identify the end of the TMS or TDI bit sequence.

Referring now to the figures, illustrative examples of and from among the various arrangements, architectures, systems and structures for practicing one or more of the various example embodiments will be described.

FIG. 1 shows one example high-level functional schematic of one example single input terminal embedded clock boundary scan test decoder, labeled generally as 10, of one or more systems and methods according to one or more embodiments.

Referring to FIG. 1, the example 10 includes a terminal 12, which may, for example, be an I/O terminal of a package having, for example, one or more ICs (not shown in FIG. 1). The example 10 is described, for purposes of illustration, in reference to a Manchester encoding scheme and, therefore, example operations are described likewise. However, as will be understood by persons of ordinary skill in the art, embedded clock coding schemes other than Manchester are known, or may be developed, and such persons can readily convert the described example 10 and its described operations to such alternative schemes.

With continuing reference to FIG. 1, since a Manchester embedded clock coding scheme is an edge coding, as opposed to a level coding, the terminal 12 may be capacitively coupled via, for example, a capacitor coupler shown as item 14, to a buffer 16. As understood by persons of ordinary skill in the relevant arts, the structure, geometry, dimensions, and technology for implementing the terminal 12, capacitor 14 and buffer 16 may be determined by such persons based on conventional guidelines and considerations such as, for example, the maximum bit rate of the Manchester (or equivalent) embedded clock coding signal. For illustrative example, bit rates such as 10 MHz, 20 MHz and 50 MHz are among, but are not any limitation of, the bit rates contemplated by the example embodiments.

Figure 2:
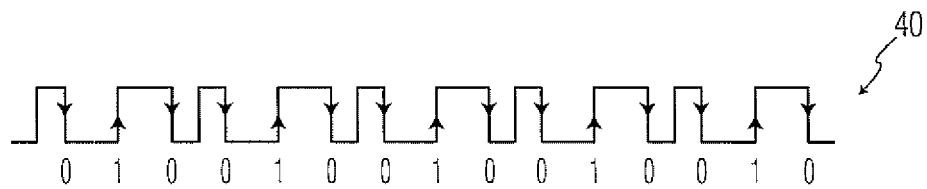
FIG. 2 shows one illustrative Manchester encoded signal for input to, for example, a single input terminal of the FIG. 1 example JTAG extraction and signal generation section.

Referring to FIG. 1, in the depicted example 10 an externally generated Manchester encoded test stream, labeled TEST_IN, may be input to the terminal 12 and coupled to the input of the buffer 16 through the capacitor 14. FIG. 2 depicts an example form of a Manchester embedded clock encoded signal, representing an arbitrary bit sequence of "010010010010010."

As show in FIG. 1, the buffer 16 may output to a Manchester decoder such as item 18 a substantially repeated version (not illustrated in FIG. 1) of the input TEST_IN embedded clock signal. The example Manchester decoder 18 then extracts a clock and bits from the input Manchester encoded signal, and outputs these as, respectively, a CLK signal on line 20 and Non Return to Zero (NRZ) bit stream, aptly labeled NRZ, on line 22. In the example 10, the Manchester decoder 18 also detects intentionally placed inactivity in the TEST_IN input signal, described previously as "timeout," and outputs a corresponding signal, labeled TIM, on line 24. A functional block diagram of one example circuit to implement the Manchester decoder 18 is described in greater detail at later sections, in reference to FIG. 5. In addition, example functions and example parameters of the TIM timeout signal are described in greater detail in later sections.

With continuing reference to FIG. 1, the CLK signal extracted from the Manchester encoded TEST_IN signal, the NRZ bits, and the TIM timeout signal (if present) are input to the boundary scan test signal decoder 26 that, in the example 10, is a JTAG decoder. The example 10 is therefore described, for purposes of illustration, in reference to the JTAG protocol. As understood by persons of ordinary skill in the art, though, other multi-pin boundary test scan protocols may be substituted, and such persons can readily convert the described example 10 and its described operations to such substitute schemes.

Referring to FIG. 1, the depicted example JTAG decoder 26 identifies which of NRZ bits are TDI bits and which if the NRZ bits are TMS bits and outputs these as TDI bits on line 28 or TMS bits on line 30, respectively, by employing the above-described TIM timeout signal along with an example header-type mechanism. One example of such generation of the TMS and TDI bits is described in greater detail at later sections, in reference to one example JTAG decoder 100 depicted at FIG. 6, and in reference to particular example TDI and TMS bit sequences depicted at FIGS. 3 and 4. The example JTAG decoder 26 also generates a JTAG format test clock, labeled TCK, based on the recovered CLK on line 32.

Figure 3:
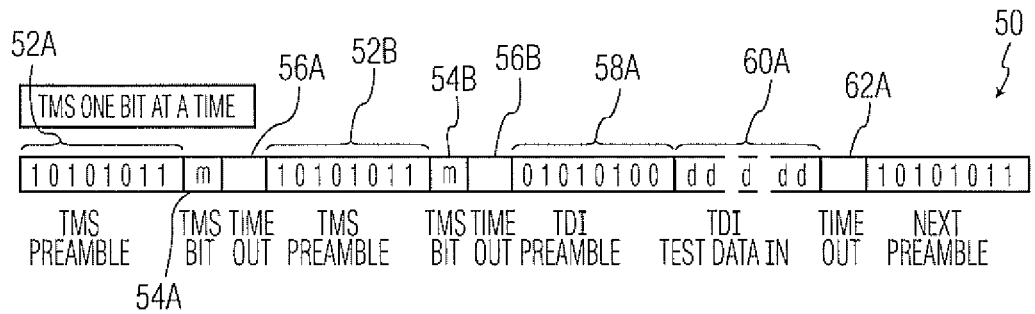
FIG. 3 shows one illustrative example decoded NRZ sequence for performing according to one example single-bit per TMS/TDI header aspect of one or more embodiments.
Figure 4:
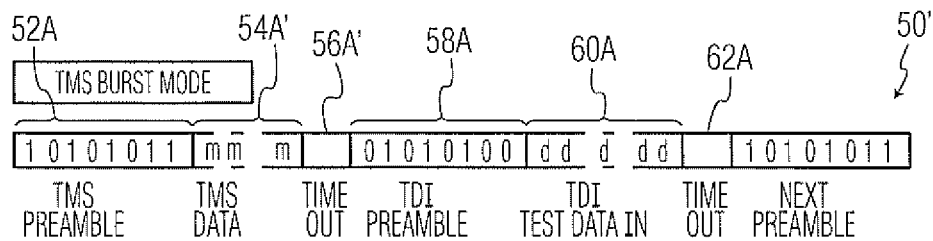
FIG. 4 shows one illustrative example decoded NRZ sequence for performing according to one example burst-bit per TMS/TDI header aspect of one or more embodiments.

Referring now to FIGS. 3 and 4, one example mechanism by which the JTAG decoder 26 identifies which of the NRZ bits are TDI bits and which are TMS bits will be described. Referring first to FIG. 3, an illustrative sequence 50 of such NRZ bits is shown. The illustrative sequence 50 may for, example, be an output of the FIG. 1 Manchester decoder 18 on its line 22. The sequence 50 includes two occurrences, labeled 52A and 52B, of an eight bit sequence of "10101011," which is an arbitrary sequence chosen for this description to represent a TMS preamble or header. The sequence 50 also includes one instance of a TDI preamble or header, labeled 58A, of an eight bit sequence of "01010100," which is an arbitrary sequence chosen for this description to represent a TDI header. In the FIGS. 3 and 4 examples, the TMS header is an assigned value that indicates that a sequence of TMS bits follows that header, and the TDI header is an assigned value that indicates that a sequence of TDI bits follows that header.

The FIG. 3 and FIG. 4 depicted example values of the example eight-bit TMS and TDI headers show these respective values as being completely orthogonal to one another and, as understood by persons of ordinary skill in the art, the bit length of the headers generally correlates with the probability of a bit sequence being mistaken for a header, and the orthogonality of the TMS and TDI headers generally provides a lower probability of error by mis-identifying the header. However, these are only illustrative values, and it will be understood that the depicted example bit lengths and bit values of the TMS and TDI headers are not a limitation on the scope of implementations for practicing according to these embodiments.

With continuing reference to FIGS. 3 and 4, information indicating the number of bits in each of the TMS and TDI sequences is also included in the TEST_IN signal. More specifically, in the examples depicted at FIGS. 3, 4 and 6, the number of bits is communicated by inserting an inactivity, for a given duration, of the TEST_IN signal at the termination of the sequence. This inactivity, as described above, is detected by the Manchester decoder 18 and is output as the timeout signal TIM. Communicating the termination, via the inactivity detected as TIM, effectively communicates the length of the sequence.

It will be understood that the above-described use of a timeout embedded in the TEST_IN signal to communicate, by indicating the end of the bit sequence, the number of TDI or TMS bits that follow a TDI or TMS header is not a limitation on the scope of the embodiments. As one illustrative example, instead of using a timeout as described above, a bit field of, for example four or eight bits (not shown in the figures), could be assigned to immediately follow the TDI or TMS field, with bits within such a field identifying the number of TDI or TMS bits that follow.

Referring to FIG. 3, the depicted example 50 communicates one-bit TMS sequences, and does so by inserting the inactivity, or timeout, labeled 56A after only one TMS bit, labeled 54A, that followed the TMS header 52A and, likewise, by the timeout labeled 56B inserted after only bit, labeled 54B, that followed the TMS header 52B. FIG. 3 therefore illustrates communicating the TMS bits one bit at a time. Circuitry (not shown) internal to the functioning electronic circuit (not shown) having the JTAG circuitry converts the one bit at a time TMS bits into a format usable by conventional JTAG circuitry. Such circuitry may be readily designed and implemented by persons of ordinary skill in the art based on this disclosure.

With continuing reference to FIG. 3, it can be seen that the TDI sequences are multi-bit, as shown by the TDI test data in sequence 60A that follows the TDI header 58A, until terminated by the timeout at 62A.

FIG. 4 shows one illustrative example decoded NRZ sequence for performing according to one example of a multi-bit TMS sequence, or a "burst-bit" aspect of sending a burst of TMS bits per TMS header according to one or more embodiments. Referring to FIG. 4, an example operation of this burst bit aspect is seen by the multi-bit sequence 54A' that follows the first TMS header 52A, the sequence continuing until terminated by the timeout, i.e., by the TIM signal generated by the Manchester decoder 18, labeled as 56A'.

Referring again to FIGS. 1, 3 and 4, as described above, the example TEST_IN signal 50 includes TMS headers 52 and TDI headers 58, and examples are described as having a JTAG encoder such as, for example, item 26, extracting and generating TDI and TMS signals based on the described example scheme of inserting timeouts 56 and 62 at the end of TMS and TDI bit streams, respectively. According to one aspect (not shown), the above-described examples may be modified to include, in addition to the TMS and TDI header, a "TRST" header (not shown) to detect a TRST or equivalent reset that may be encoded into the TEST_IN signal.

Figure 5:
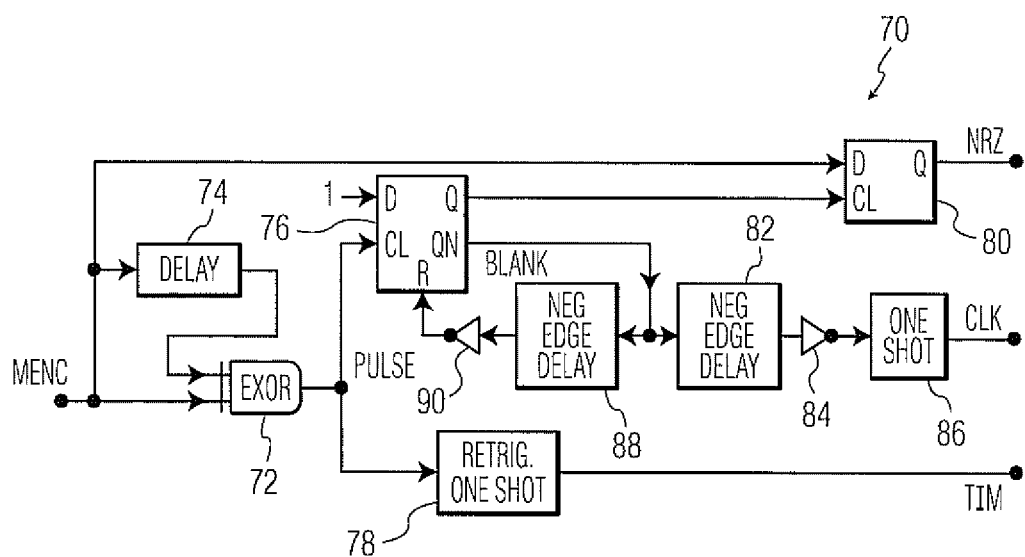
FIG. 5 shows one example functional schematic of one illustrative Manchester to NRZ decoder sub-section of the FIG. 1 example, and of equivalents to the FIG. 1 example, having a single input terminal JTAG extraction and signal generation aspect of one or more systems and methods according to one or more embodiments.

FIG. 5 shows one example functional schematic of one illustrative Manchester to NRZ decoder, labeled generally as 70, that may implement the Manchester decoder 18 of the FIG. 1 example 10. The Manchester decoder 70 may be in accordance with a conventional Manchester decoder such as, for example, that described in U.S. Pat. No. 3,979,746 ("the '746 patent"), all portions of which that describe Manchester encoding and decoding are hereby incorporated by reference.

Referring to FIG. 5, the example 70 includes an exclusive-OR gate 72 having two inputs, one receiving a signal labeled "Ment" that is an embedded clock encoded signal of a format such as, for example, the FIG. 2 Manchester signal 40. The "Menc" signal may be the TEST_IN signal shown at FIG. 1, or its coupled signal at the input (not separately labeled) of the buffer 16, or the input (not separately labeled) of the FIG. 1 Manchester decoder 18.

With continuing reference to FIG. 5, the example Manchester decoder 70 further includes a delay 74 which inputs a delayed version of the Menc signal to the exclusive-OR gate 72. The amount of delay that item 74 must provide is readily determinable by persons of ordinary skill in the art. The output (not separately labeled) of the gate 72 is a sequence of pulses (not illustrated), each having a width determined amount of delay provided by item 74. The sequence of pulses output from gate 72 is input to the CL clock input of the "D" flip-flop 76 and to the input (not separately numbered) of the retriggerable one-shot 78. The function of the retriggerable one-shot 78 is to detect inactivity of the TEST_IN signal that exceeds, for example, 1.5 bit periods and, in response, to output the timeout signal TIM.

Referring to FIG. 5, the example Manchester decoder 70 further includes an NRZ output "D" flip-flop 80 that receives the Menc signal on its D input and the Q output of the "D" flip-flop 76 on its clock input CL. The toggling of the D flip-flop 80 is performed by an alternating reception of edges on the D input and the CL input of the flip-flop 80. The edges triggering the CL input of the flip-flop 80 are generated by the "QN" output of the flip-flop 76 feeding back through the negative edge delay 88, through an inverter 90, to the reset R of the flip-flop 76. The CLK signal is derived from the edges of at the QN output of the flip-flop 76 being delayed by the negative edge delay 82, passing through the buffer 84, and triggering the one-shot 86. Alternatives and modifications of the described example 70 may be readily understood by persons of ordinary skill in the art upon reading this description in view of, for example, known Manchester decoding structures and methods such as, for example, those described at the '746 and other patents.

Figure 6:
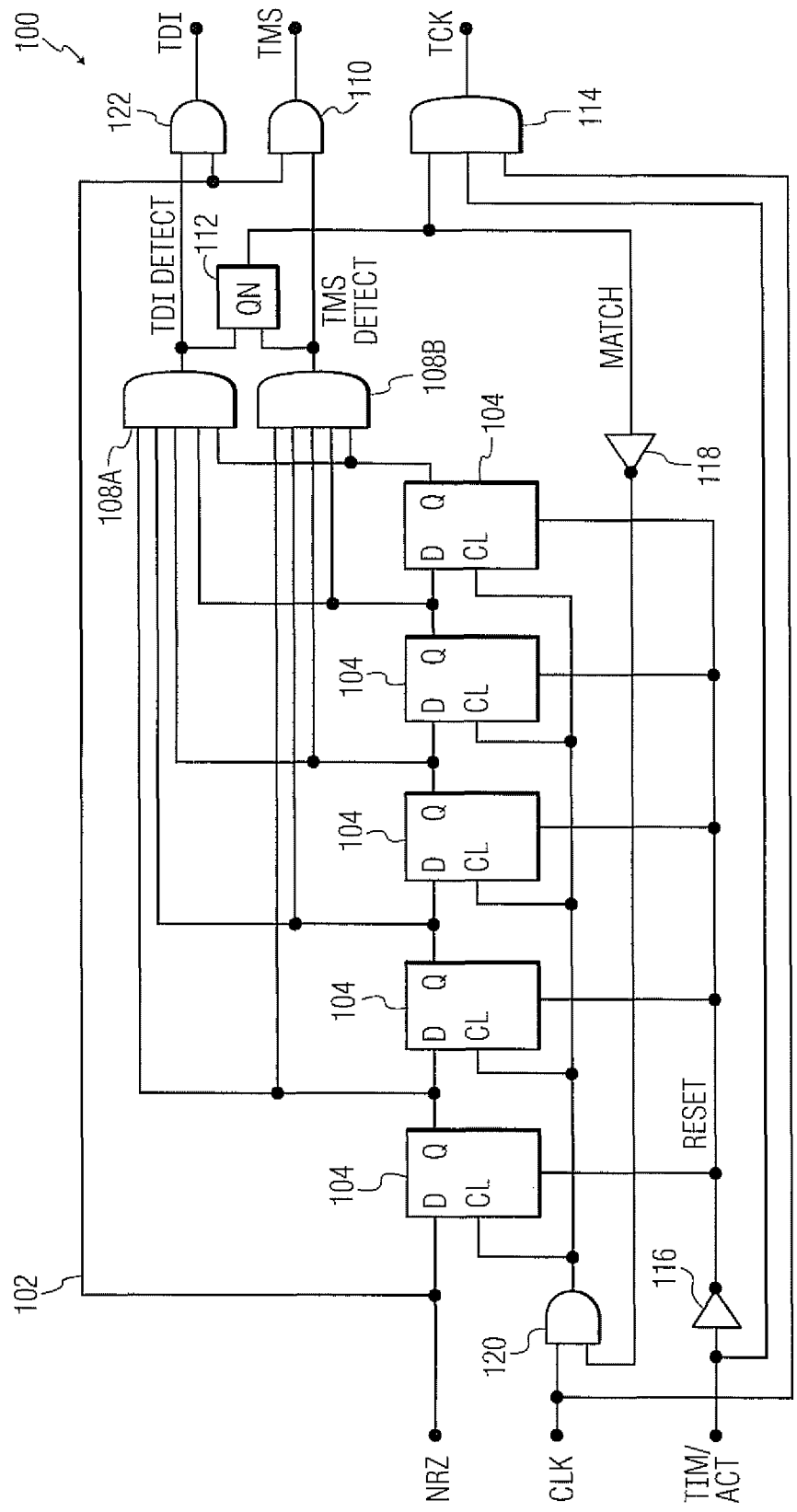
FIG. 6 shows one example functional schematic of one example NRZ to JTAG signal generator and mode decoder sub-section of the FIG. 1 example, and its equivalent of one input terminal JTAG extraction and signal generation aspect of one or more embodiments.

FIG. 6 shows one example implementation of a JTAG decoder, labeled generally as 100, that may implement the JTAG decoder 26 of FIG. 1. One example generation of the TDI, TMS and TCK signals will be described in reference to the example 100. It will be readily understood upon reading this description that the example 100 is not a limitation on the generation of signals such as TDI, TMS and TCK, and that various alternatives to the example 100 can readily be constructed by persons of ordinary skill in the art.

Referring now to FIG. 6, the NRZ encoded state input to line 102 is shifted into five D-flip-flops, referenced collectively as 104, by the recovered clock CLK that is input to line 106. The NRZ encoded state input may, for this example, be the NRZ output on line 22 of the FIG. 1 Manchester decoder 18, or the NRZ output from flip-flop 80 the FIG. 5 example specific implementation 70 of the FIG. 1 decoder 18. It will be understood that the specific quantity of five of the D flip-flops 104 is related to the specific number of bits, namely eight, of the described example TDI and TMS headers or preamble. A person of ordinary skill in the art will readily identify, and can readily implement, modifications of, and alternatives to, the FIG. 6 example 100 to accommodate TDI and TMS, or equivalent, headers having other than eight bits.

With continuing reference to FIG. 6, the outputs (not separately numbered) of the flip-flops 104 are connected to two five-input AND gates, labeled 108A and 108B. As shown, the AND gates 108A and 108B have inverting inputs, marked with a "−" label, and non inverting inputs, not marked with a "−" label. Referring to FIGS. 3 and 4, the assignment of which of the inputs of the AND gates 108A and 108B are inverting and which are non-inverting is dictated by the particular assigned value of the TMS header and TDI header. In the FIGS. 3 and 4 example, the TMS header is assigned as "10101011."

Referring to FIG. 6, assuming there is an occurrence of this example FIGS. 3 and 4 TMS header, after five clock edges the value of the "Q" outputs (not separately labeled) of the five D flips flops 104, going in a left-to-right order from the first or leftmost to the last or rightmost is: "01011." Therefore, the inputs to the AND gate 108B, in top to bottom order" are "01011." Since the first and third of the inputs to the AND gate 108B are inverting, the actual input to the AND gate 108B is then "11111." The output of the AND gate 108B is therefore logical "1." This logical "1" is input to lower input (not separately labeled) of the TMS AND gate 110, and to the lower input (not separately labeled" of the OR gate 112. The sixth NRZ bit (i.e., the bit immediately following "01011," is then output by the TMS AND gate 110 as a valid TMS bit. Assuming the timeout signal TIM (which is active low) is at a logical "1" state, the OR gate 112 feeds back through the buffer 118 to the CLK gate 120, and the three-input TCK AND gate 114 then outputs the TCK clock signal, synchronous with the CLK signal.

With continuing reference to FIGS. 5 and 6, as soon as no CLK transitions are observed by the Manchester Decoder 18, the TIM signal changes, which passes through the inverter 116 and resets the shift registers 104 to zero. This interrupts the data flow to the JTAG pins, and the JTAG decoder 100 is ready to detect a new TMS or TDI header or preamble.

The above-described example operation is in reference to a TMS header. A very similar operation is performed upon occurrence of a TDI header. The difference is that, referring to FIGS. and 4, after five clock edges the value of the "Q" outputs (not separately labeled) of the five D flips flops 104, going in a left-to-right order from the first or leftmost to the last or rightmost is: "10100." Therefore, the inputs to the AND gate 108A, in top to bottom order" are "10100." Since the second, fourth and fifth of the inputs to the AND gate 108A are inverting, the actual input to the AND gate 108A is then "11111." The output of the AND gate 108A is therefore logical "1," which is input to the lower input (not separately labeled) of the TDI AND gate 122, and to the upper input (not separately labeled" of the OR gate 112. The sixth NRZ bit (i.e., the bit immediately following "10100," is then output by the TDI AND gate 122 as a valid TDI bit. Assuming the timeout signal TIM (which is active low) is at a logical "1" state, the three-input TCK AND gate 114 then outputs the TCK clock signal, synchronous with the CLK signal Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention.

Accordingly, the foregoing disclosure, description, and figures are for illustrative purposes only and do not in any way limit the invention, which is defined only by the claims.

We hereby claim:

1. A testable electronic circuit connected to a terminal, comprising:
   an embedded clock boundary scan test decoder connected to said terminal, configured to receive a given embedded clock encoded signal having encoded test information bits, generate a test clock signal based on the received signal, detect the encoded test information bits and, in response to the detected test information bits matching a given preamble sequence, generate a sequence of test state control bits based on a subsequently received sequence of the encoded test information bits; and
   an electronic function circuit connected to said terminal, wherein said electronic function circuit is switchable, in response to the generated sequence of the test state control bits, between an operational mode and a test mode, and configured to perform, in the test mode, a test operation in accordance with the generated sequence of the test state control bits and the generated test clock signal, and output a corresponding test output data signal.

2. The testable electronic circuit of claim 1, wherein the embedded clock boundary scan test decoder is configured to generate the sequence of the test state control bits as Joint Action Test Group (JTAG) Test Mode Select (TMS) bits in response to the test information bits matching a first preamble sequence, and to generate the test state control bits as JTAG Test Data In (TDI) bits in response to the test information bits matching a second preamble sequence, wherein the electronic function circuit includes a JTAG state machine configured to switch the electronic function circuit between the operational mode and the test mode in response to generated TMS bits.

3. The testable electronic circuit of claim 2, wherein the embedded clock boundary scan test decoder further comprises:
   an embedded clock decoder circuit connected to said terminal configured to extract the test information bits from the embedded clock encoded signal, output the extracted test information bits and detect whether a characteristic of a signal received on the terminal fails to meet a given signal valid criterion for a given duration and, in response to said detecting, output a timeout signal; and
   a boundary scan test signal decoder circuit configured to receive the test information bits, the embedded clock encoded signal, and the timeout signal and, in response to detecting a sequence of the test information bits meeting the first preamble sequence, generate TMS bits based on subsequently received test information bits until receiving the timeout signal, and, in response to detecting a sequence of the test information bits meeting the second preamble sequence, generate TDI bits based on subsequently received test information bits until receiving the timeout signal.

4. The testable electronic circuit of claim 3, wherein the embedded clock decoder circuit is a Manchester decoder connected to said terminal and, in response to receiving on said terminal a Manchester encoded signal having encoded test information bits, configured to recover and output the test information bits and a recovered test clock signal.

5. The testable electronic circuit of claim 2, wherein the electronic function circuit further comprises:
a HAG state machine configured to switch states to switch the electronic function circuit among the plurality of test modes in response to the generated sequence of TMS bits.

6. The testable electronic circuit of claim 2, wherein the embedded clock boundary scan test decoder is configured to store a given test data preamble,
detect a match of a sequence of the test information bits and the given test data preamble, and,
in response to said detecting, generate a sequence of test data input bits based on the test information bits, wherein said electronic function circuit is configured to perform the given test operation on at least one of the generated sequence of test data input bits.

7. The testable electronic circuit of claim 2, wherein the embedded clock boundary scan test decoder is configured to
generate the test state control bits as test mode control bits in response to detecting a sequence of the test information bits meeting a given first preamble sequence,
generate the test state control bits as test data input bits in response to detecting a sequence of the test information bits meeting a given second preamble sequence,
detect whether a characteristic of a signal received on the terminal fails to meet a given signal valid criterion for a given duration, and,
in response to said detecting, terminate the generating of the test state control bits.

8. The testable electronic circuit of claim 1, wherein the embedded clock boundary scan test decoder further comprises:
an embedded clock decoder circuit, connected to said terminal, configured to extract the test information bits, recover the embedded clock encoded signal, output the extracted test information bits and the recovered clock encoded signal, detect whether a characteristic of the signal received on the terminal fails to meet a criterion for a given duration, and, in response to said detecting, output a timeout signal; and
a boundary scan test signal decoder circuit configured to receive the test information bits, the recovered clock encoded signal, and the timeout signal and, in response to detecting the test information bits meeting the given preamble sequence, generate the test clock signal and the test state control bits based on subsequently received test information bits until receiving the timeout signal.

9. The testable electronic circuit of claim 8, wherein the embedded clock decoder circuit is a Manchester decoder connected to said terminal and, in response to receiving on said terminal a Manchester encoded signal having encoded test information bits, configured to recover and output the test information bits and a recovered test clock signal.

10. The testable electronic circuit of claim 1, wherein the embedded clock boundary scan test decoder is configured to store a given test data preamble, detect a match of a sequence of the test information bits and the given test data preamble, and, in response to said detecting, generate a sequence of test data input bits based on the test information bits, and said electronic function circuit is configured to perform the test operation on at least one of the generated sequence of test data input bits.

11. The testable electronic circuit of claim 1, wherein the embedded clock boundary scan test decoder is configured to
generate the test state control bits as test mode control bits in response to detecting a sequence of the test information bits meeting a given first preamble sequence,
generate the test state control bits as test data input bits in response to detecting a sequence of the test information bits meeting a given second preamble sequence,
detect whether a characteristic of the signal received on the terminal fails to meet a given signal valid criterion for a given duration, and,
in response to said detecting, terminate the generating of the test state control bits.

12. The testable electronic circuit of claim 1, wherein at least one of the embedded clock boundary scan test decoder and the electronic function circuit further comprises:
a power supply rail connected to the terminal, the power supply rail configured to receive external power and to provide said received power to the at least one of the embedded clock boundary scan test decoder and the electronic function circuit.

13. The testable electronic circuit of claim 1, wherein at least one of the embedded clock boundary scan test decoder and electronic function circuit includes a power supply rail connected to the terminal, and the power supply rail is configured to receive external power and to provide said received power to the at least one of the embedded clock boundary scan test decoder and electronic function circuit.

14. A method for performing JTAG boundary scan testing of an electronic circuit connected to a terminal, the electronic circuit having a JTAG boundary scan test circuit to distribute JTAG Test Mode Select (TMS) bits and JTAG Test Data Input (TDI) bits to selectable portions of the electronic circuit and to detect states of the electronic circuit in relation to the TMS and TDI bits, the method comprising:
generating an embedded clock encoded signal having an encoded first header followed by at least one encoded TMS bit and an encoded second header followed by at least one TDI bit;
receiving said generated clock encoded signal at said terminal;
extracting test bits and a test clock from said received clock encoded signal;
detecting an occurrence of said encoded first header in said extracted test bits and, in response, generating a sequence of at least one TMS bit based on the at least one TMS bit following said detected occurrence;
detecting an occurrence of said encoded second header in said extracted test bits and, in response, generating a sequence of at least one TDI bit based on the at least one TDI bit following said detected occurrence; and
performing a JTAG boundary scan test in accordance with said generated TMS bits, said generated TDI bits, and said extracted test clock.

15. The method of claim 14, wherein the embedded clock encoded signal is a Manchester encoded signal, and said extracting a recovered clock and said test bits includes a Manchester decoding.

16. A method for testing an electronic circuit connected to a terminal, the electronic circuit having a boundary scan test circuit to distribute given test bits to a selectable portion of the electronic circuit and to distribute given circuit test mode select bits to a selectable portion of the electronic circuit, to detect states of the electronic circuit in relation to the given test bits and the given circuit test mode select bits, and to output corresponding state data, the method comprising:
receiving a given embedded clock encoded signal at said terminal, said received clock encoded signal having encoded test information bits;
extracting a recovered clock signal and said test information bits from said received clock encoded signal;

detecting a characteristic of the received clock encoded signal and generating a timeout signal if said received clock encoded signal fails to meet said characteristic for a given duration;

generating a sequence of one or more of the circuit test mode select bits in response to detecting a sequence of the test information bits meeting a given first preamble sequence and input, said generating continuing until receiving said timeout signal;

generating a sequence of one or more of circuit test data bits in response to detecting a sequence of the test information bits meeting a given second preamble sequence, said generating continuing until receiving said timeout signal; and performing test operations on the electronic circuit in accordance with the circuit test mode select bits, the circuit test data bits, and the recovered clock signal; and outputting a corresponding test output data signal.

17. The method of claim 16, further comprising:

distributing, with said boundary scan test circuit, JTAG format Test Mode Select (TMS) bits, Test Data Input (TDI) bits, and Test Clock (TCK) signals to the electronic circuit, wherein said generating the sequence of one or more of the circuit test mode select bits generates the TMS bits, and generating the sequence of one or more of the circuit test data bits generates the TDI bits.

18. The method of claim 16, wherein the given embedded clock encoded signal is a Manchester encoded signal and said extracting step further comprises Manchester decoding.

19. The method of claim 16, wherein said terminal is a power input terminal of the electronic circuit.

\* \* \* \* \*